US012191333B2

United States Patent
Tseng et al.

(10) Patent No.: US 12,191,333 B2
(45) Date of Patent: Jan. 7, 2025

(54) SOLID-STATE IMAGE SENSOR

(71) Applicant: VisEra Technologies Company Limited, Hsin-Chu (TW)

(72) Inventors: Pin-Chia Tseng, Hsin-Chu (TW); Yu-Chi Chang, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 415 days.

(21) Appl. No.: 17/679,708

(22) Filed: Feb. 24, 2022

(65) Prior Publication Data
US 2023/0268364 A1 Aug. 24, 2023

(51) Int. Cl.
*H01L 27/146* (2006.01)

(52) U.S. Cl.
CPC .. *H01L 27/14627* (2013.01); *H01L 27/14629* (2013.01); *H01L 27/1463* (2013.01)

(58) Field of Classification Search
CPC ........ H01L 27/14627; H01L 27/14629; H01L 27/1463; H01L 27/14605; H01L 27/14607; H01L 27/14621; H01L 27/14623; H01L 27/14625; H01L 27/1464; H01L 27/14643; H01L 27/14685
See application file for complete search history.

(56) References Cited

U.S. PATENT DOCUMENTS

| | | | | |
|---|---|---|---|---|
| 6,228,674 B1 * | 5/2001 | Pan | .................... | H01L 27/14609 438/197 |
| 6,255,681 B1 * | 7/2001 | Pan | .................... | H01L 27/14609 257/292 |
| 2010/0230583 A1 * | 9/2010 | Nakata | .............. | H01L 27/14621 257/E31.127 |
| 2012/0273910 A1 | 11/2012 | Hochshulz et al. | | |
| 2014/0239431 A1 | 8/2014 | Miyashita | | |
| 2019/0148422 A1 | 5/2019 | Cheng et al. | | |
| 2020/0194474 A1 | 6/2020 | Meynants | | |
| 2022/0149098 A1 * | 5/2022 | Wang | .................. | H01L 27/1463 |

FOREIGN PATENT DOCUMENTS

| | | |
|---|---|---|
| CN | 108470740 | 8/2018 |
| JP | 2003-060179 | 2/2003 |
| JP | 2010-205994 | 9/2010 |

(Continued)

OTHER PUBLICATIONS

Japanese Office Action dated Aug. 22, 2023 in Application No. 2022126968 is attached, 28 pages.

*Primary Examiner* — J. E. Schoenholtz
(74) *Attorney, Agent, or Firm* — MUNCY, GEISSLER, OLDS & LOWE, P.C.

(57) ABSTRACT

A solid-state image sensor is provided. The solid-state image sensor includes photoelectric conversion units and modulation structures embedded in the photoelectric conversion units. The solid-state image sensor also includes isolation structures disposed between the photoelectric conversion units and a protective layer disposed on the photoelectric conversion units. From the top view of the solid-state image sensor, the photoelectric conversion units and the modulation structures form mosaic patterns, and the ratio of the area of one modulation structure to the area of the corresponding mosaic pattern is between 0.1 and 0.9.

19 Claims, 14 Drawing Sheets

(56) References Cited

FOREIGN PATENT DOCUMENTS

| | | |
|---|---|---|
| JP | 2011-086888 | 4/2011 |
| JP | 2020-086408 | 6/2020 |
| JP | 2022-058101 | 4/2022 |
| TW | 201921661 A | 6/2019 |
| TW | 202133413 A | 9/2021 |
| TW | 202137524 A | 10/2021 |
| WO | WO2013/046972 | 4/2013 |
| WO | WO2019/159561 | 8/2019 |

* cited by examiner

SOLID-STATE IMAGE SENSOR

BACKGROUND

Technical Field

The embodiments of the present disclosure relate to image sensors, and in particular they relate to solid-state image sensors that include modulation structures embedded in the photoelectric conversion units.

Description of the Related Art

Solid-state image sensors (e.g., charge-coupled device (CCD) image sensors, complementary metal-oxide semiconductor (CMOS) image sensors, and so on) have been widely used in various image-capturing apparatuses such as digital still-image cameras, digital video cameras, and the like. The light-sensing portion in the solid-state image sensor may be formed to correspond to each pixel, and signal electric charges may be generated according to the amount of light received in the light-sensing portion. In addition, the signal electric charges generated in the light-sensing portion may be transmitted and amplified, whereby an image signal is obtained.

When a solid-state image sensor is used for sensing light having longer wavelengths (e.g., 650 nm or longer), the depletion region of the photoelectric conversion unit (e.g., photodiode) has to be very deep. Moreover, incident light (that has longer wavelengths) moves straight up and down in the corresponding photoelectric conversion unit. As a result, the optical path for the incident light to be sensed is not long enough, and the incident light cannot be completely converted into electrons by the photoelectric conversion unit, so that the quality of the image signal from the photoelectric conversion units of the solid-state image sensors may be unsatisfactory. Therefore, there are still various challenges in the design and manufacturing of solid-state image sensors.

BRIEF SUMMARY

In some embodiments of the present disclosure, the solid-state image sensor includes modulation structures embedded in the photoelectric conversion units, which may change the optical path of the incident light (to be longer) without increasing the thickness of the photoelectric conversion element, thereby improving the quality of the image signal from the photoelectric conversion units of the solid-state image sensors.

In accordance with some embodiments of the present disclosure, a solid-state image sensor is provided. The solid-state image sensor includes photoelectric conversion units and modulation structures embedded in the photoelectric conversion units. The solid-state image sensor also includes isolation structures disposed between the photoelectric conversion units and a protective layer disposed on the photoelectric conversion units. From the top view of the solid-state image sensor, the photoelectric conversion units and the modulation structures form mosaic patterns, and the ratio of the area of one modulation structure to the area of the corresponding mosaic pattern is between 0.1 and 0.9.

In some embodiments, the refraction index of the modulation structures is different from the refraction index of the photoelectric conversion units, and from the top view of the solid-state image sensor, the modulation structures form an array.

In some embodiments, the modulation structures are disposed on top portions or bottom portions of the photoelectric conversion units.

In some embodiments, the thickness of the modulation structures is equal to $m \times \lambda / 2n$, where m is a positive integer, $\lambda$ is the wavelength of a light to be sensed, and n is the refraction index of the modulation structures.

In some embodiments, from the top view of the solid-state image sensor, the modulation structures are in a periodic arrangement.

In some embodiments, from the top view of the solid-state image sensor, the shapes of the modulation structures comprise triangles, rectangles, squares, or trapezoids.

In some embodiments, from the top view of the solid-state image sensor, the modulation structures have at least two different shapes.

In some embodiments, from the top view of the solid-state image sensor, the modulation structures have different shapes in two adjacent mosaic patterns.

In some embodiments, from the top view of the solid-state image sensor, the mosaic patterns form a checkerboard-like pattern.

In some embodiments, from the top view of the solid-state image sensor, the modulation structures form a plurality of cross patterns.

In some embodiments, from the top view of the solid-state image sensor, the modulation structures have at least two different sizes.

In some embodiments, from the top view of the solid-state image sensor, the modulation structures extend in the same direction.

In some embodiments, from the top view of the solid-state image sensor, the modulation structures extend in two perpendicular directions.

In some embodiments, from the top view of the solid-state image sensor, the ratio of the area of one of the modulation structures to the area of the corresponding mosaic pattern is 0.5.

In some embodiments, from the top view of the solid-state image sensor, the ratio of the area of one of the modulation structures to the area of the corresponding mosaic pattern is variable.

In some embodiments, the solid-state image sensor further includes a metal grid disposed in the bottom of the protective layer and corresponding to the isolation structures.

In some embodiments, the solid-state image sensor further includes condensing structures disposed above the protective layer. Each condensing structure corresponds to one photoelectric conversion unit.

In some embodiments, the solid-state image sensor further includes a reflection layer disposed below the photoelectric conversion units.

In some embodiments, the modulation structures are disposed at different depths of the photoelectric conversion units.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
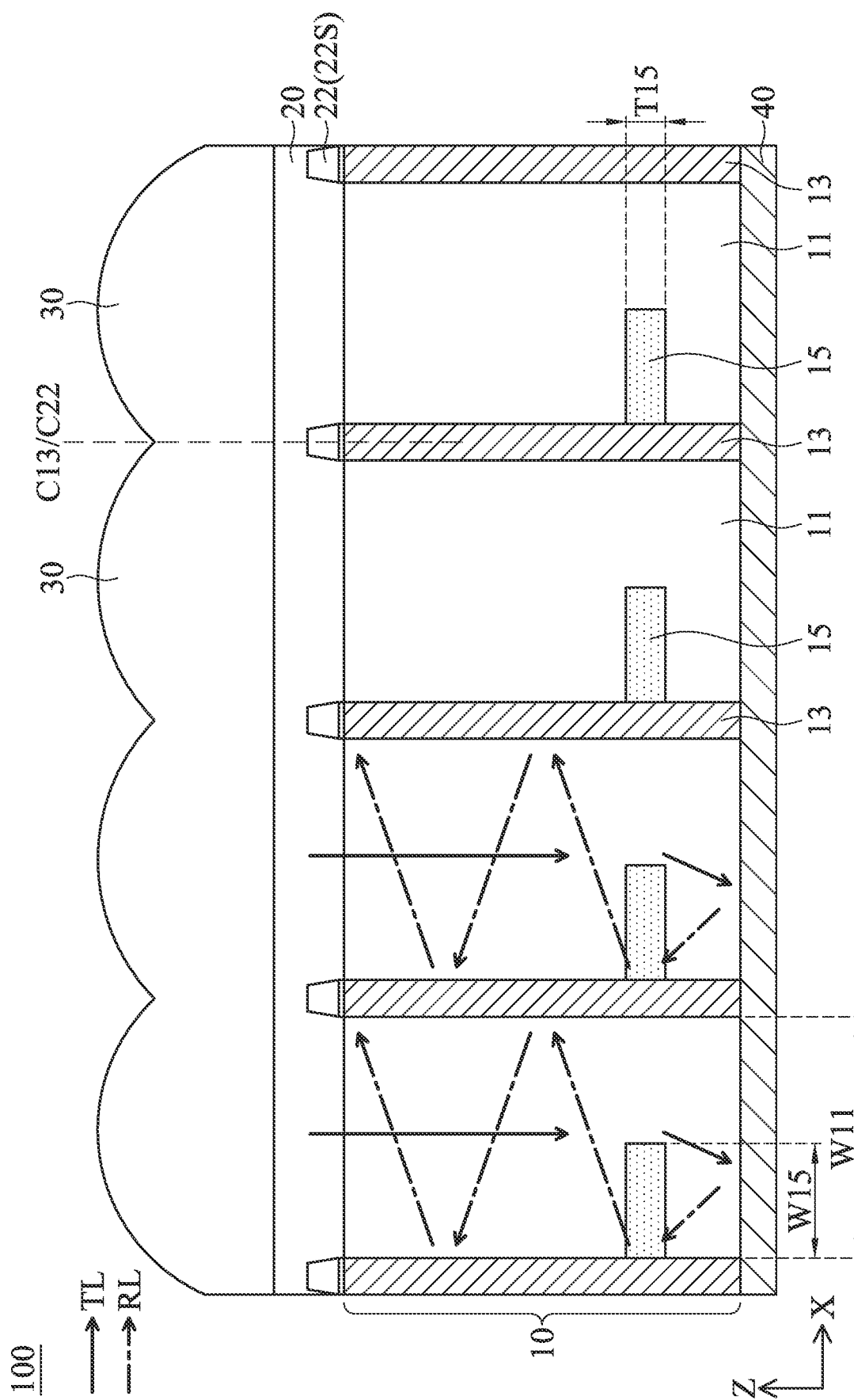
FIG. 1 is a cross-sectional view illustrating a portion of the solid-state image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +1-5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a cross-sectional view illustrating a portion of the solid-state image sensor 100 in accordance with some embodiments of the present disclosure. The solid-state imaging device 100 may be formed of a complementary metal-oxide semiconductor (CMOS) image sensor or a charge coupled device (CCD) image sensor, but the present disclosure is not limited thereto. It should be noted that some components of the solid-state image sensor 100 have been omitted in FIG. 1 for the sake of brevity.

Referring to FIG. 1, in some embodiments, the solid-state image sensor 100 includes a semiconductor substrate 10. The semiconductor substrate 10 may be a wafer or a chip. For example, the semiconductor substrate 10 may include silicon, but the present disclosure is not limited thereto.

As shown in FIG. 1, in some embodiments, the semiconductor substrate 10 has a plurality of photoelectric conversion units 11. For example, the photoelectric conversion units 11 may be formed by a process such as an ion implantation process and/or a diffusion process. Moreover, the photoelectric conversion units 11 may be configured to form transistors, photodiodes, PIN diodes and/or light-emitting diodes, but the present disclosure is not limited thereto. In some embodiments, the photoelectric conversion units 11 form an array structure.

As shown in FIG. 1, in some embodiments, the semiconductor substrate 10 has a plurality of isolation structures 13 disposed between the photoelectric conversion units 11. For example, the isolation structures 13 may be deep trench isolation (DTI) structure. The isolation structures 13 may be formed in the semiconductor substrate 10 using etching process to form trenches and filling the trenches with an insulating or dielectric material, but the present disclosure is not limited thereto. In other words, the photoelectric conversion units 11 in the semiconductor substrate 10 are isolated from each other by isolation structures 13.

As shown in FIG. 1, the solid-state image sensor 100 includes modulation structures 15 embedded in the photoelectric conversion units 11. For example, the modulation structures 15 may include silicon oxides, silicon nitrides, silicon oxynitrides, or other suitable insulating materials, and be formed by a deposition process, but the present disclosure is not limited thereto. The deposition process is, for example, spin-on coating, chemical vapor deposition (CVD), flowable chemical vapor deposition (FCVD), plasma enhanced chemical vapor deposition (PECVD), physical vapor deposition (PVD), or another deposition technique.

In some embodiments, the refraction index of the modulation structures 15 is different from the refraction index of the photoelectric conversion units 11, so that the modulation structure 15 may change the optical path of incident light that enters the corresponding photoelectric conversion unit 11.

The modulation structures 15 may be disposed at any depth of the photoelectric conversion unit 11, which may be adjusted according to actual needs. In the embodiment shown in FIG. 1, the modulation structures 15 are disposed at the same depth of the photoelectric conversion unit 11, but the present disclosure is not limited thereto. In some embodiments, the thickness T15 of the modulation structures 15 is equal to m×λ/2n, where m is a positive integer, λ is the wavelength of a light to be sensed, and n is the refraction index of the modulation structures 15.

Figure 2:
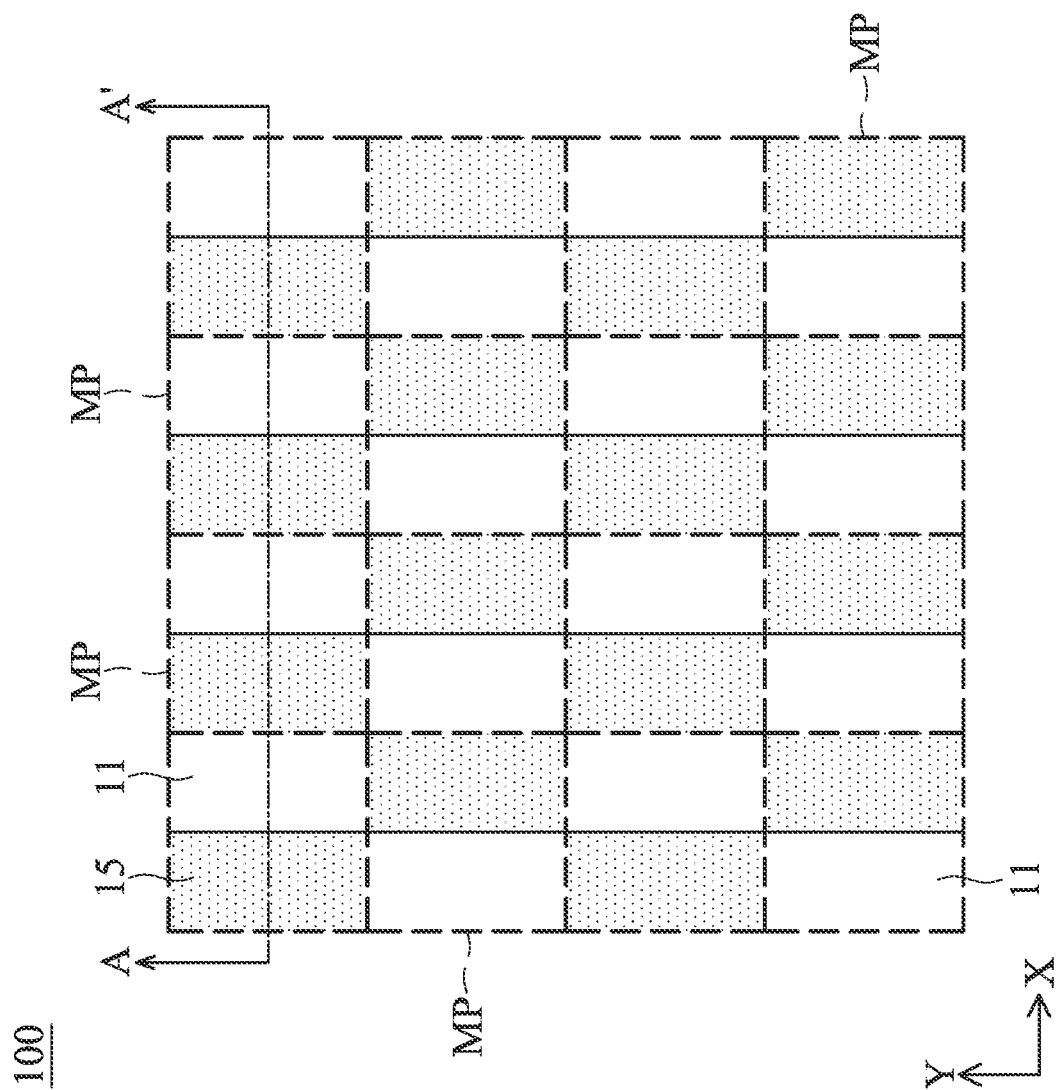
FIG. 2 illustrates an arrangement of the photoelectric conversion units and the modulation structures from the top view of a portion of the solid-state image sensor 100 in accordance with some embodiments of the present disclosure.

FIG. 2 illustrates an arrangement of the photoelectric conversion units 11 and the modulation structures 15 from the top view of a portion of the solid-state image sensor 100 in accordance with some embodiments of the present disclosure. For example, FIG. 1 may be the cross-sectional view illustrating a portion of the solid-state image sensor 100 along line A-A' in FIG. 2, but the present disclosure is not limited thereto.

Referring to FIG. 2, from the top view of the solid-state image sensor 100, the photoelectric conversion units 11 and the modulation structures 15 form a plurality of mosaic patterns MP, and the mosaic patterns MP are shown in FIG. 2 with dashed boxes. For example, FIG. 2 shows sixteen mosaic patterns MP that form as a 4×4 pixel array, but the present disclosure is not limited thereto.

Similarly, in some embodiment, from the top view of the solid-state image sensor 100, the modulation structures 15 form an array. In the embodiment shown in FIG. 2, the modulation structures 15 are in a periodic arrangement, but the present disclosure is not limited thereto. In some other embodiments, the modulation structures 15 are in an aperiodic arrangement.

In some embodiments, from the top view of the solid-state image sensor 100, the ratio of the area the modulation structure 15 to the area of the corresponding mosaic pattern MP is between about 0.1 and about 0.9. For example, the ratio of the area of the modulation structure 15 to the area of the mosaic pattern MP is about 0.5 in every mosaic pattern MP in FIG. 2, but the present disclosure is not limited thereto. In other words, as shown in FIG. 1, the ratio of the width W15 of the modulation structure 15 to the width W11 of the corresponding photoelectric conversion unit 11 is about 0.5 in the cross-sectional view of the solid-state image sensor 100.

As shown in FIG. 2, in some embodiments, from the top view of the solid-state image sensor 100, each modulation structure 15 is formed as a rectangle. In other words, in some embodiments, from the top view of the solid-state image sensor 100, the modulation structures 15 extend in the same direction (e.g., Y-direction in FIG. 2), but the present disclosure is not limited thereto. In some embodiments, from the top view of the solid-state image sensor 100, shapes of the modulation structures 15 include triangles, rectangles, squares, or trapezoids.

As shown in FIG. 1, the solid-state image sensor 100 includes a protective layer 20 disposed on the photoelectric conversion units 11 (semiconductor substrate 10). For example, the protective layer 20 may include the same or similar material to the isolation structures 13, but the present disclosure is not limited thereto. Moreover, the protective layer 20 may be formed on the photoelectric conversion units 11 by a deposition process. Examples of the deposition process have been described above, and will not be repeated here.

As shown in FIG. 1, in some embodiments, the solid-state image sensor 100 includes a metal grid 22 disposed in the bottom of the protective layer 20. In more detail, the metal grid 22 corresponds to the isolation structures 13. For example, as shown in FIG. 1, the metal grid 22 has (or may be divided into) a plurality of metal grid segments 22S, and the central axis C22 of the metal grid segment 22S may overlap the central axis C13 of the corresponding isolation structure 13, but the present disclosure is not limited thereto. The central axis C22 of the metal grid segment 22S may have a shift with respect to the central axis C13 of the corresponding isolation structure 13.

Moreover, the metal grid 22 may include gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

As shown in FIG. 1, the solid-state image sensor 100 includes condensing structures 30 disposed above the protective layer 20. The condensing structure 30 may include glass, epoxy resin, silicone resin, polyurethane, any other applicable material, or a combination thereof, but the present disclosure is not limited thereto. For example, the condensing structure 30 may be formed by a photoresist reflow method, a hot embossing method, any other applicable method, or a combination thereof. Moreover, the steps of forming the condensing structure 30 may include a spin coating process, a lithography process, an etching process, any other applicable process, or a combination thereof, but the present disclosure is not limited thereto.

As shown in FIG. 1, in some embodiments, each condensing structure 30 corresponds to one photoelectric conversion unit 11, but the present disclosure is not limited thereto. In some other embodiments, each condensing structure 30 corresponds to two or more photoelectric conversion units 11.

The condensing structure 30 may be a micro-lens. For example, the micro-lens may include a semi-convex lens or a convex lens, but the present disclosure is not limited thereto. The condensing structure 30 may also include micro-pyramid structures (e.g., circular cone, quadrangular pyramid, and so on), or micro-trapezoidal structures (e.g., flat top cone, truncated square pyramid, and so on). Alternatively, the condensing structure 30 may be a gradient-index structure.

As shown in FIG. 1, the solid-state image sensor 100 includes a reflection layer 40 disposed below the photoelectric conversion units 11. For example, the reflection layer 40 may include metal, such as gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto. Similarly, the reflection layer 40 may be formed by physical vapor deposition (PVD), chemical vapor deposition (CVD), atomic layer deposition (ALD), evaporation, sputtering, the like, or a combination thereof.

As shown in FIG. 1, when incident light (i.e., transmittance light TL) enters the photoelectric conversion unit 11 of the solid-state image sensor 100 according to the embodiments of the present disclosure, the modulation structure 15 embedded in the photoelectric conversion unit 11 may change the optical path (which includes the path of transmittance light TL and reflection light RL) of the incident light (to be longer) without increasing the thickness of the photoelectric conversion unit 11.

For example, when the incident light has longer wavelengths (e.g., about 920 nm to about 960 nm), the photoelectric conversion efficiency may increase more than 10% (normalize photoelectric conversion efficiency) compared with the traditional solid-state image sensor (that includes no modulation structure 15), and the reflectivity may decrease, for example, 1% to 15% (normalize reflectivity). Therefore, the quality of the image signal from the photoelectric conversion units 11 of the solid-state image sensors 100 may be improved without increasing the thickness of the photoelectric conversion unit 11.

Figure 3A:
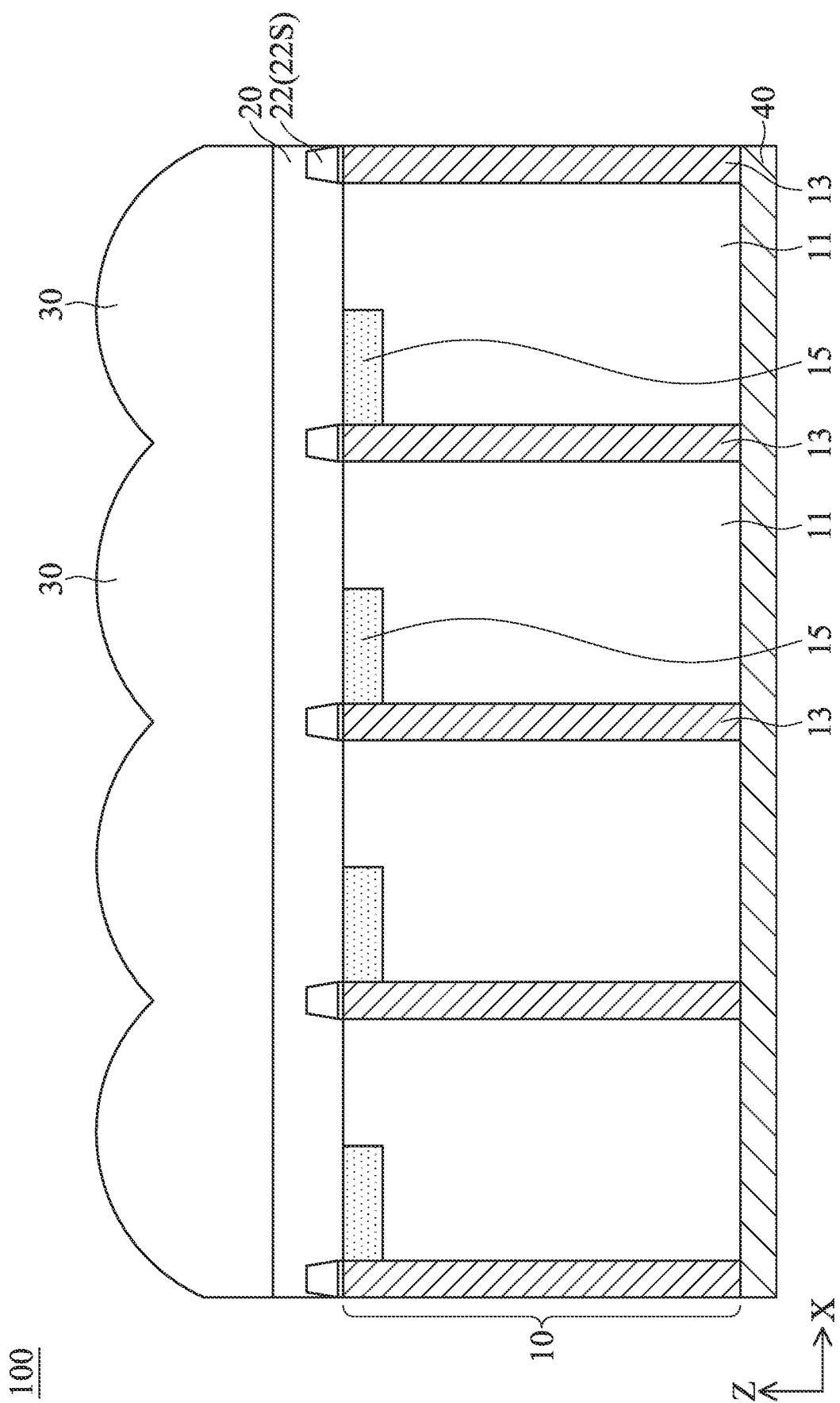
FIG. 3A, FIG. 3B, and FIG. 3C are cross-sectional views illustrating a portion of the solid-state image sensor in accordance with some other embodiments of the present disclosure.
Figure 3B:
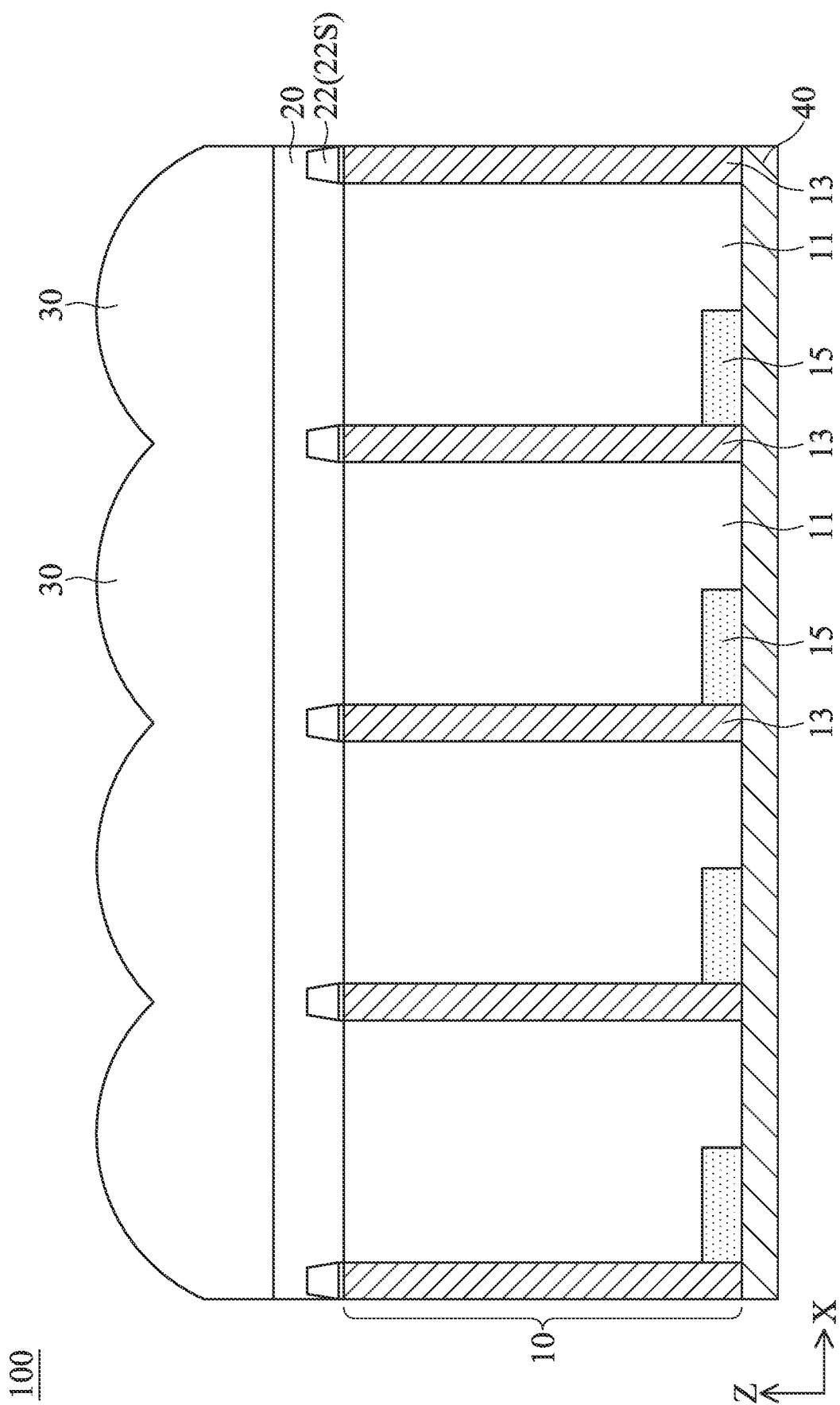
Figure 3C:
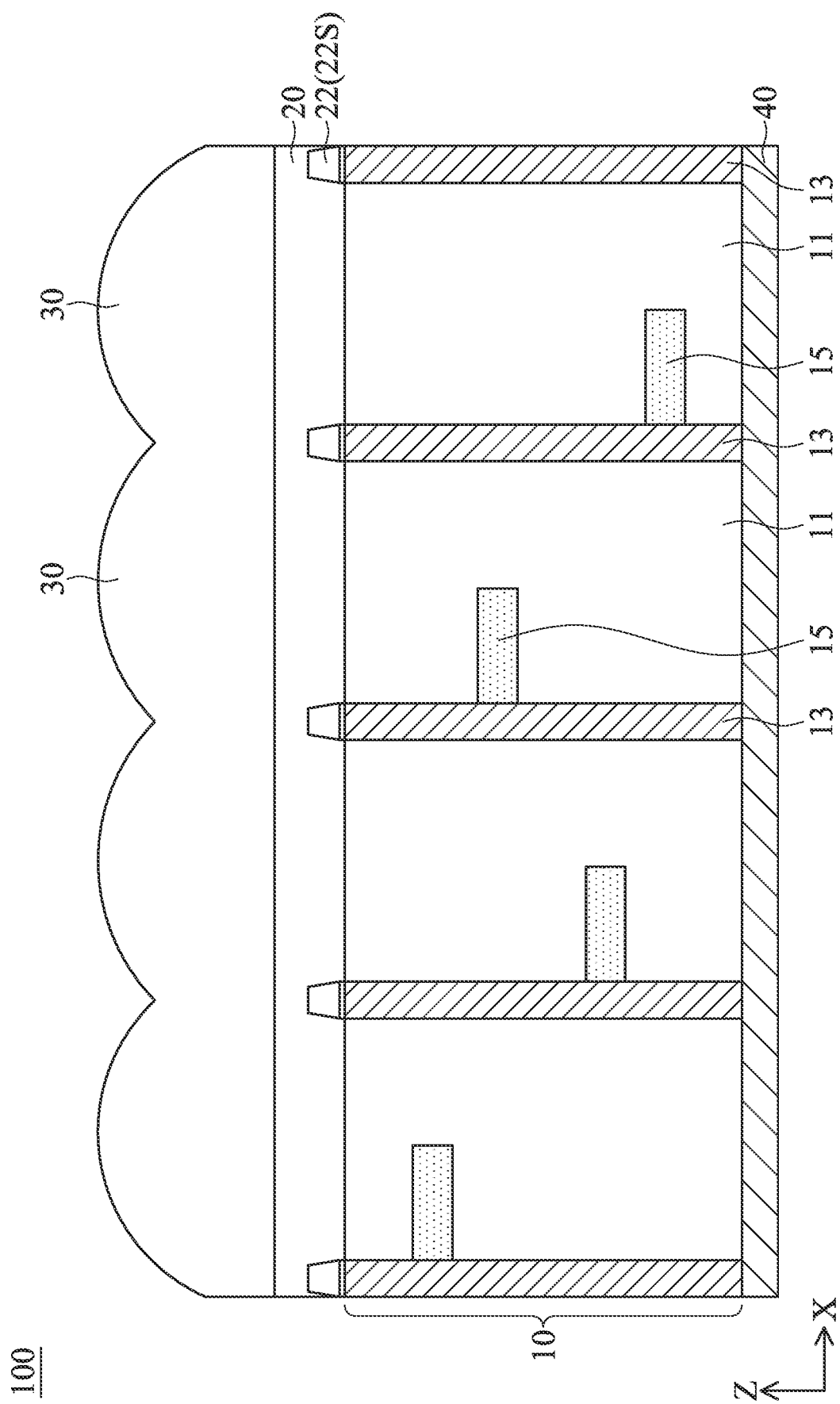

FIG. 3A, FIG. 3B, and FIG. 3C are cross-sectional views illustrating a portion of the solid-state image sensor 100 in accordance with some other embodiments of the present disclosure. For example, FIG. 3A, FIG. 3B, and FIG. 3C may be the cross-sectional view illustrating a portion of the solid-state image sensor 100 along line A-A' in FIG. 2. That is, FIG. 3A, FIG. 3B, or FIG. 3C may replace FIG. 1 as the cross-sectional view of the solid-state image sensor 100 shown in FIG. 2.

Referring to FIG. 3A, in some embodiments, the modulation structures 15 are disposed on top portions of the photoelectric conversion units 11. Referring to FIG. 3B, in some embodiments, the modulation structures 15 are disposed on bottom portions of the photoelectric conversion units 11. In the embodiments shown in FIG. 3A and FIG. 3B, forming the modulation structures 15 on top portions or bottom portions of the photoelectric conversion units 11 may reduce the process steps and further reduce the process time.

Referring to FIG. 3C, in some embodiments, the modulation structures 15 are disposed at different depths of the photoelectric conversion units 11. The thickness and position of the modulation structures 15 may be adjusted according to the actual needs.

Figure 4A:
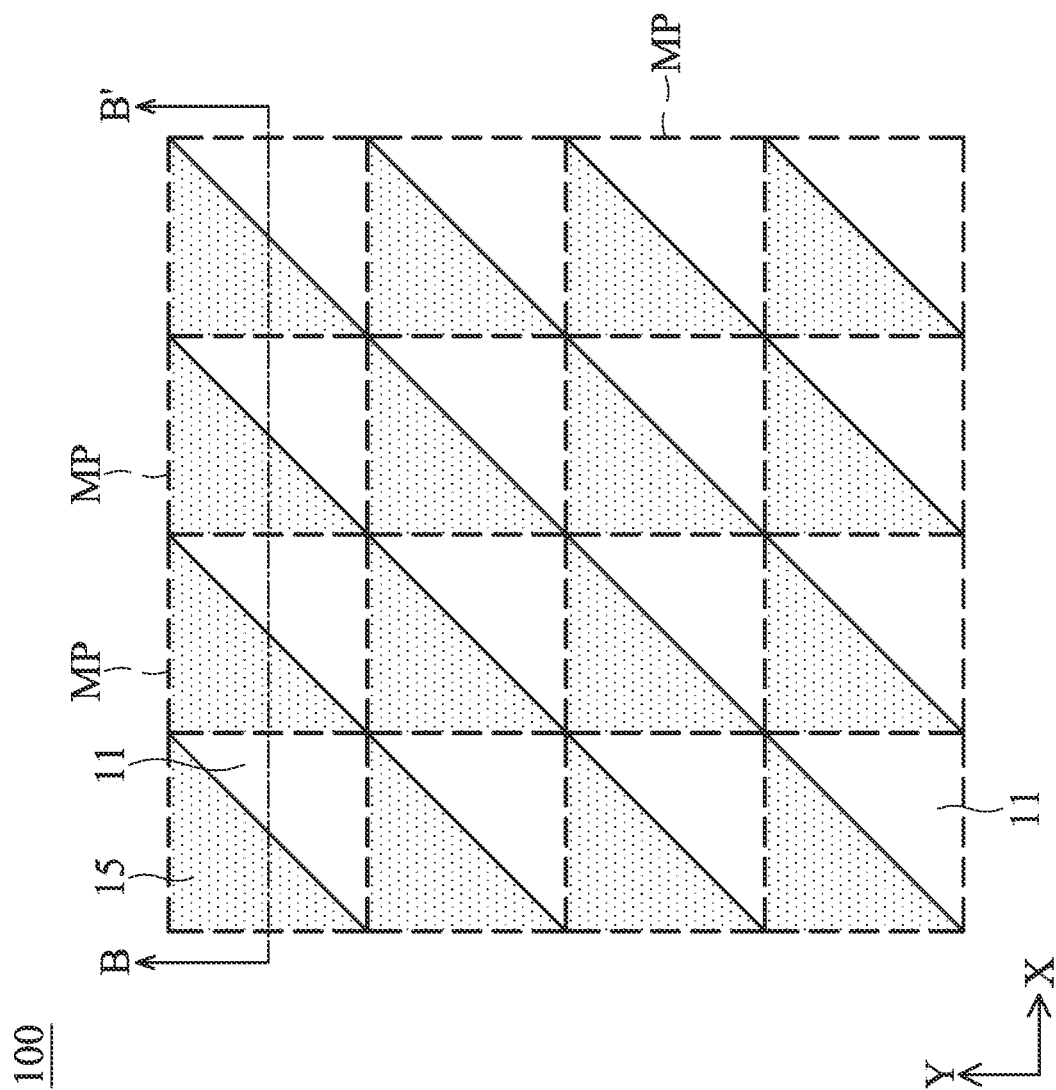
FIG. 4A and FIG. 4B illustrate arrangements of the photoelectric conversion units and the modulation structures from the top view of a portion of the solid-state image sensor in accordance with some other embodiments of the present disclosure.
Figure 4B:
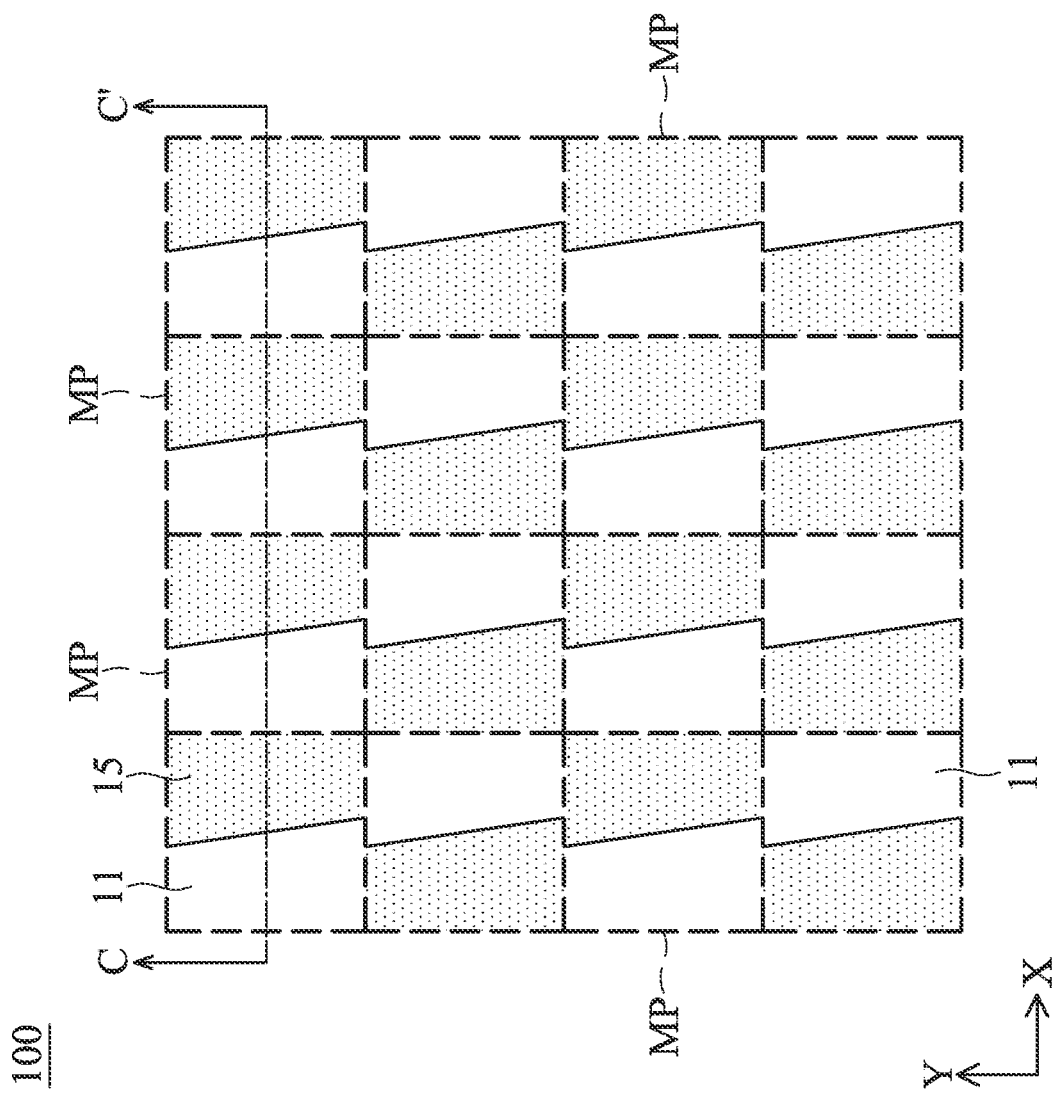

FIG. 4A and FIG. 4B illustrate arrangements of the photoelectric conversion units 11 and the modulation structures 15 from the top view of a portion of the solid-state image sensor 100 in accordance with some other embodiments of the present disclosure. For example, FIG. 1, FIG. 3A, FIG. 3B, or FIG. 3C may be the cross-sectional view illustrating a portion of the solid-state image sensor 100 along line B-B' in FIG. 4A or line C-C' in FIG. 4B, but the present disclosure is not limited thereto.

Referring to FIG. 4A, in some embodiments, from the top view of the solid-state image sensor 100, each modulation structure 15 is formed as a triangle. In other words, the boundary between the modulation structure 15 and the corresponding photoelectric conversion unit 11 overlaps one diagonal line of the mosaic pattern MP. Referring to FIG. 4B, in some embodiments, from the top view of the solid-state image sensor 100, each modulation structure 15 is formed as a trapezoid.

Figure 5:
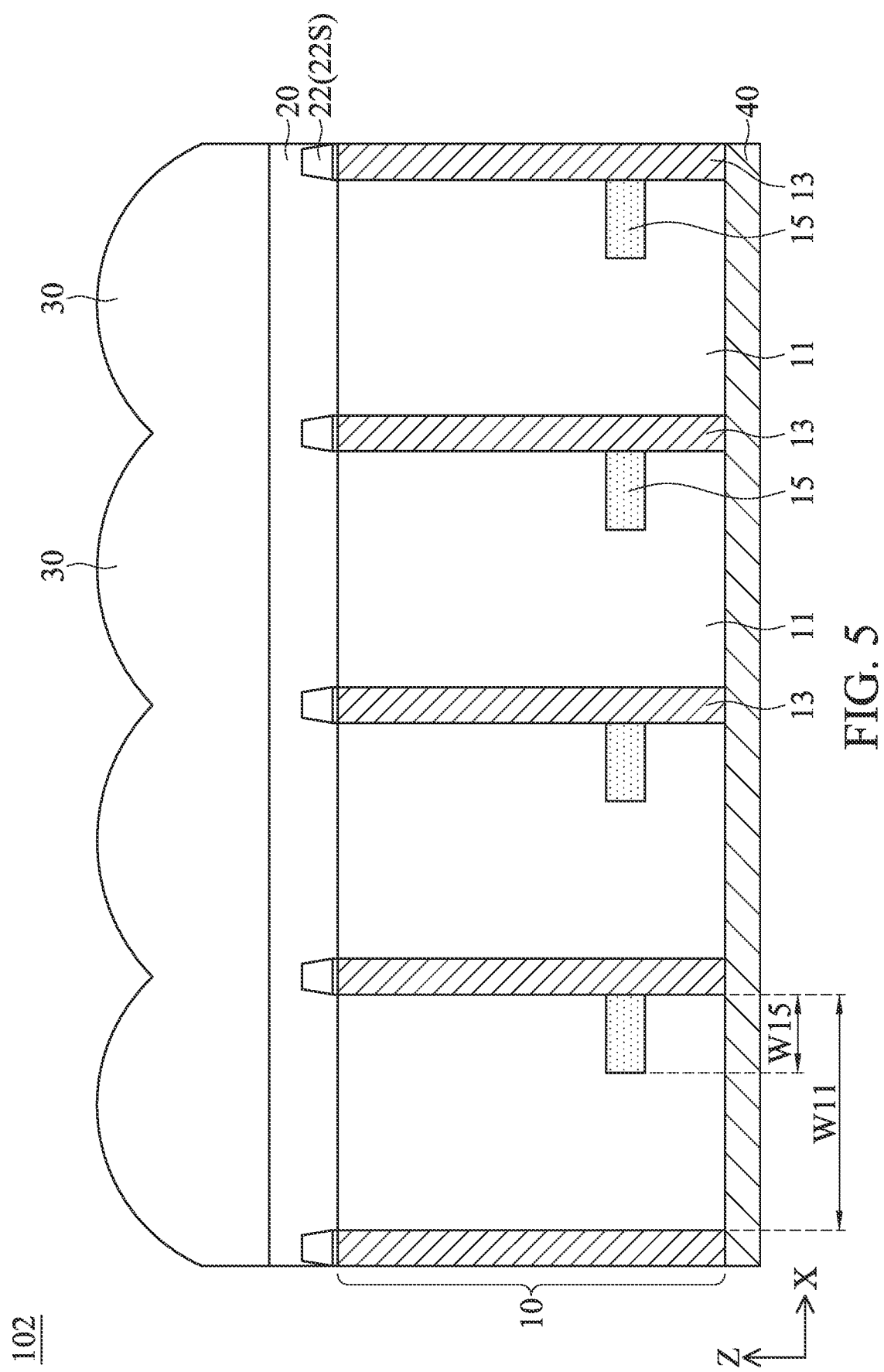
FIG. 5 is a cross-sectional view illustrating a portion of the solid-state image sensor in accordance with some embodiments of the present disclosure.
Figure 6:
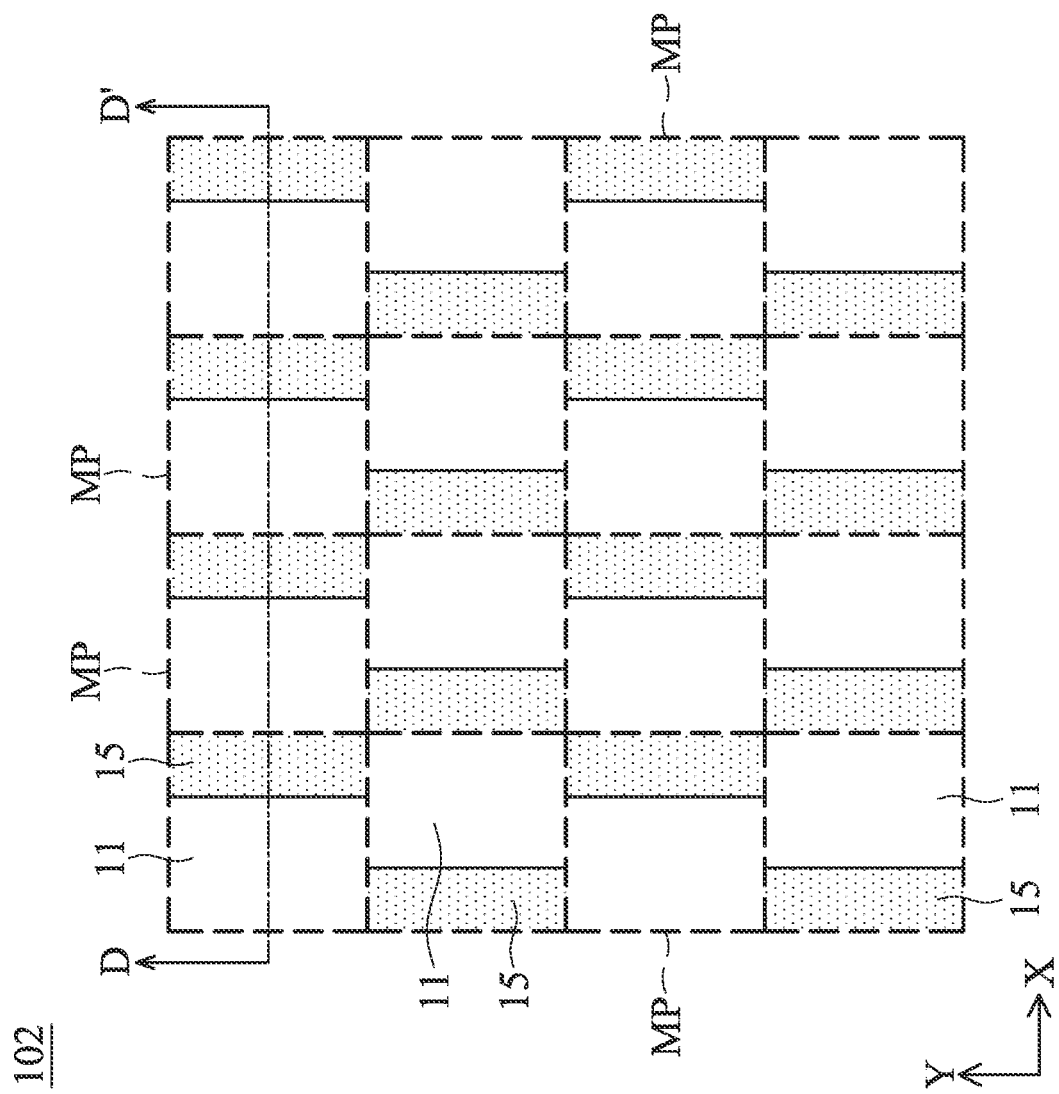
FIG. 6 illustrates an arrangement of the photoelectric conversion units and the modulation structures from the top view of a portion of the solid-state image sensor in accordance with some embodiments of the present disclosure.

FIG. 5 is a cross-sectional view illustrating a portion of the solid-state image sensor 102 in accordance with some embodiments of the present disclosure. FIG. 6 illustrates an arrangement of the photoelectric conversion units 11 and the modulation structures 15 from the top view of a portion of the solid-state image sensor 102 in accordance with some embodiments of the present disclosure. For example, FIG. 5 may be the cross-sectional view illustrating a portion of the solid-state image sensor 102 along line D-D' in FIG. 6, but the present disclosure is not limited thereto.

The solid-state image sensor 102 shown in FIG. 5 and FIG. 6 has a similar structure to the solid-state image sensor 100 shown in FIG. 1 and FIG. 2. The main difference from the solid-state image sensor 100 shown in FIG. 1 and FIG. 2 is that from the top view of the solid-state image sensor 102 (e.g., FIG. 6), the area of the modulation structure 15 is smaller than the area of the corresponding photoelectric conversion unit 11 in each mosaic pattern MP. For example, the ratio of the area of the modulation structure 15 to the area of the mosaic pattern MP is about 0.33 in every mosaic pattern MP in FIG. 6, but the present disclosure is not limited thereto. In other words, as shown in FIG. 5, the ratio of the width W15 of the modulation structure 15 to the width W11 of the corresponding photoelectric conversion unit 11 is about 0.33 in the cross-sectional view of the solid-state image sensor 102.

Figure 7:
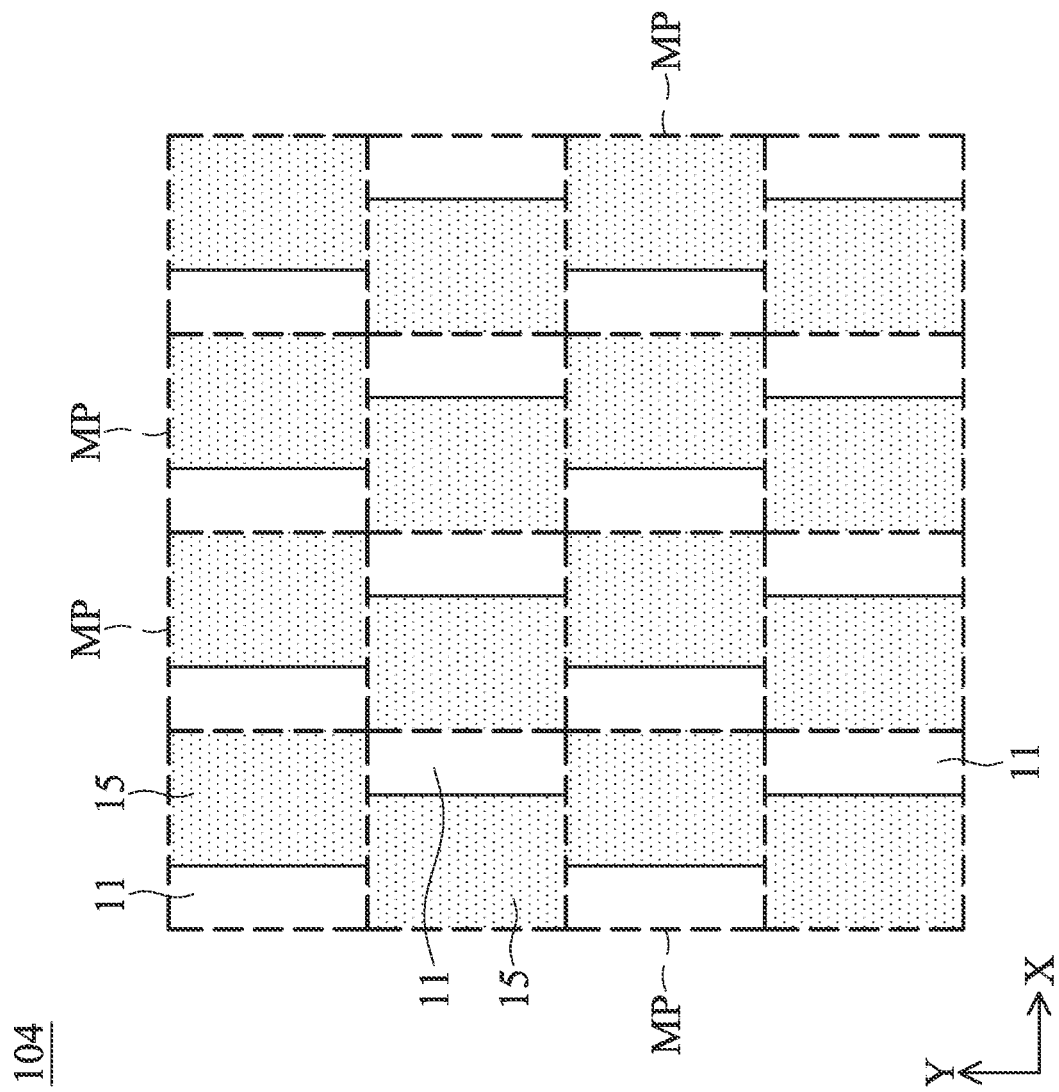
FIG. 7 illustrates an arrangement of the photoelectric conversion units and the modulation structures from the top view of a portion of the solid-state image sensor 104 in accordance with some other embodiments of the present disclosure.

FIG. 7 illustrates an arrangement of the photoelectric conversion units 11 and the modulation structures 15 from the top view of a portion of the solid-state image sensor 104 in accordance with some other embodiments of the present disclosure. From the top view of the solid-state image sensor 104 shown in FIG. 7, the area of the modulation structure 15 is larger than the area of the corresponding photoelectric conversion unit 11 in each mosaic pattern MP. For example, the ratio of the area of the modulation structure 15 to the area of the mosaic pattern MP is about 0.66 in every mosaic pattern MP in FIG. 7, but the present disclosure is not limited thereto.

Figure 8:
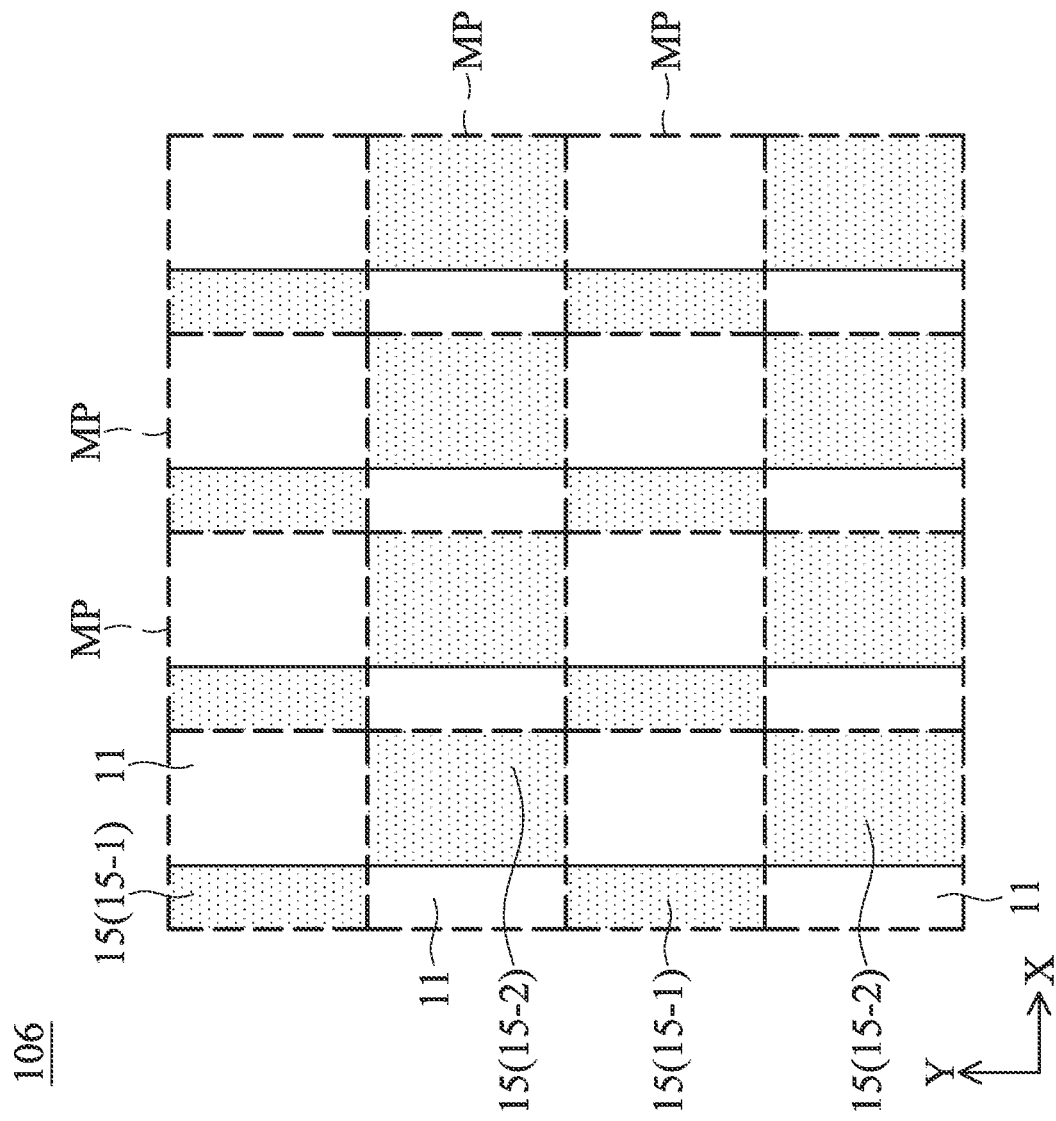
FIG. 8 illustrates an arrangement of the photoelectric conversion units and the modulation structures from the top view of a portion of the solid-state image sensor in accordance with some other embodiments of the present disclosure.

FIG. 8 illustrates an arrangement of the photoelectric conversion units 11 and the modulation structures 15 from the top view of a portion of the solid-state image sensor 106 in accordance with some other embodiments of the present disclosure. In some embodiments, the modulation structures 15 have at least two different sizes. For example, as shown in FIG. 8, the modulation structures 15-1 and the modulation structures 15-2 have different sizes. In more detail, from the top view of the solid-state image sensor 106 shown in FIG. 8, the area of the modulation structure 15-1 is smaller than the area of the corresponding photoelectric conversion unit 11 in each mosaic pattern MP in the first row and the third row, and the area of the modulation structure 15-2 is larger than the area of the corresponding photoelectric conversion unit 11 in each mosaic pattern MP in the second row and the fourth row, but the present disclosure is not limited thereto.

Figure 9:
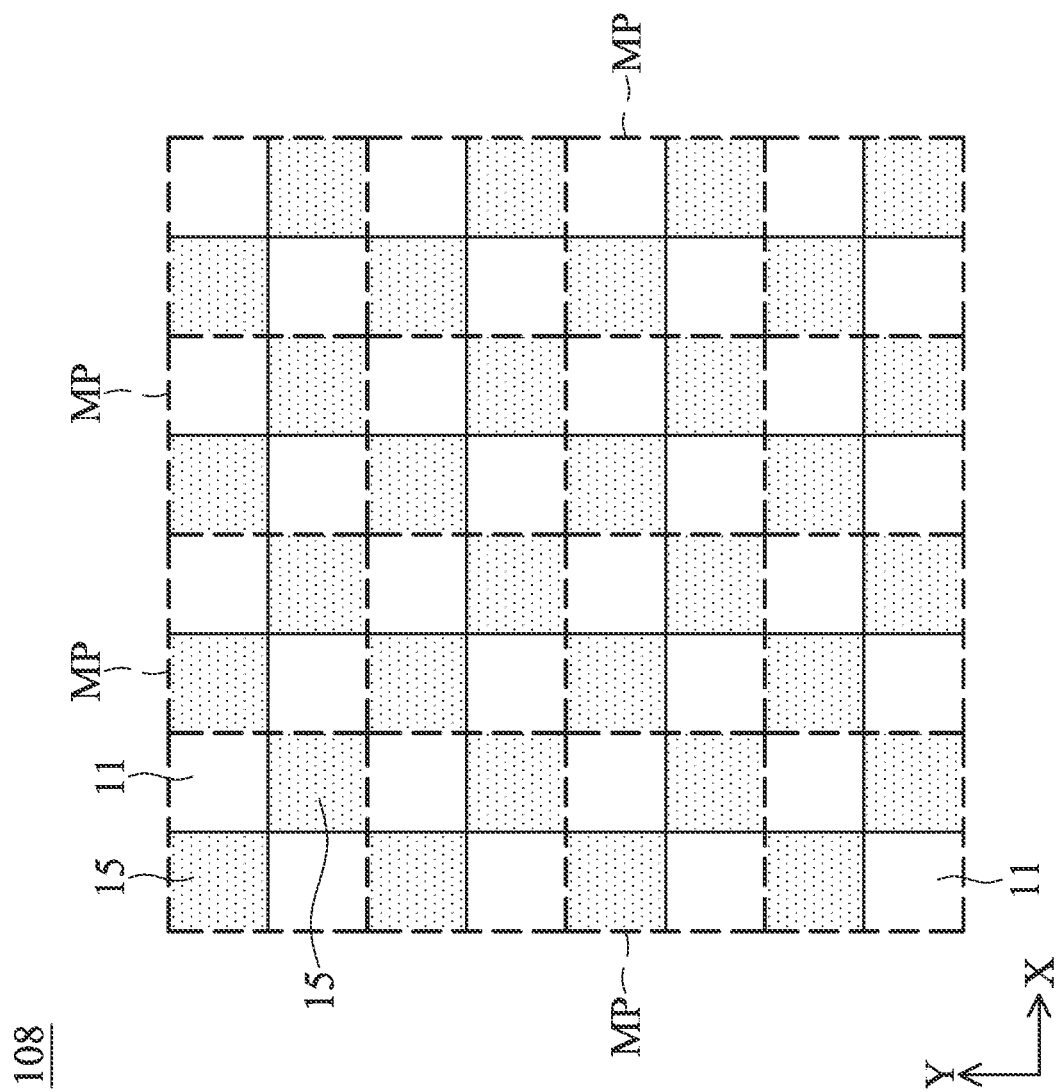
FIG. 9 illustrates an arrangement of the photoelectric conversion units and the modulation structures from the top view of a portion of the solid-state image sensor in accordance with some other embodiments of the present disclosure.

FIG. 9 illustrates an arrangement of the photoelectric conversion units 11 and the modulation structures 15 from the top view of a portion of the solid-state image sensor 108 in accordance with some other embodiments of the present disclosure. As shown in FIG. 9, from the top view of the solid-state image sensor 108, the mosaic patterns MP form a checkerboard-like pattern. In more detail, there may be two modulation structures 15 embedded in each mosaic pattern MP, and from the top view of the solid-state image sensor 108, the two modulation structures 15 may be formed as squares and arranged diagonally, but the present disclosure is not limited thereto.

Figure 10:
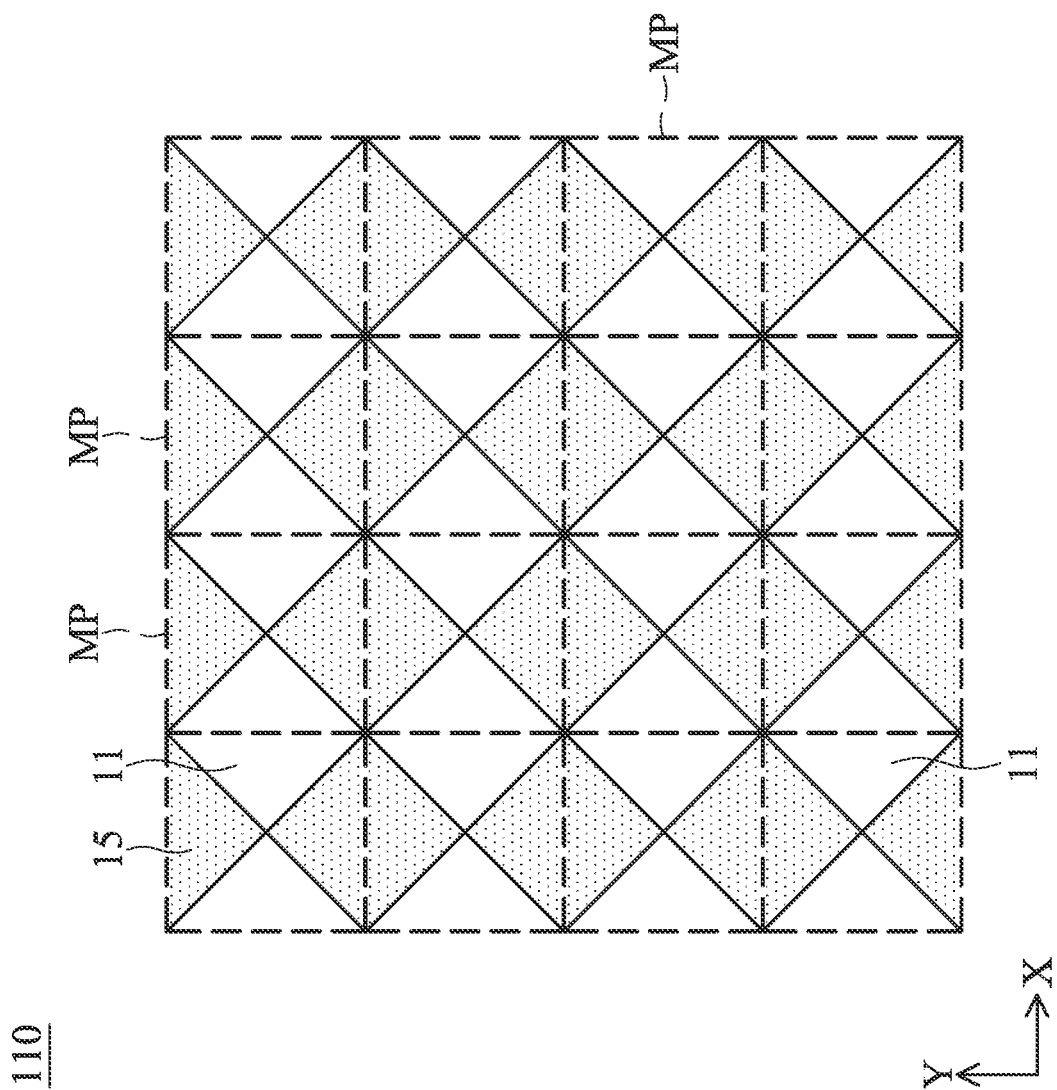
FIG. 10 illustrates an arrangement of the photoelectric conversion units and the modulation structures from the top view of a portion of the solid-state image sensor in accordance with some other embodiments of the present disclosure.

FIG. 10 illustrates an arrangement of the photoelectric conversion units 11 and the modulation structures 15 from the top view of a portion of the solid-state image sensor 110 in accordance with some other embodiments of the present disclosure. As shown in FIG. 10, from the top view of the solid-state image sensor 110, the modulation structures 15 (or the mosaic patterns MP) form a plurality of cross patterns. In more detail, there may be two modulation structures 15 embedded in each mosaic pattern MP, and from the top view of the solid-state image sensor 110, two modulation structures 15 in the same mosaic pattern MP may be formed as right triangles with the tips facing each other, but the present disclosure is not limited thereto.

Figure 11:
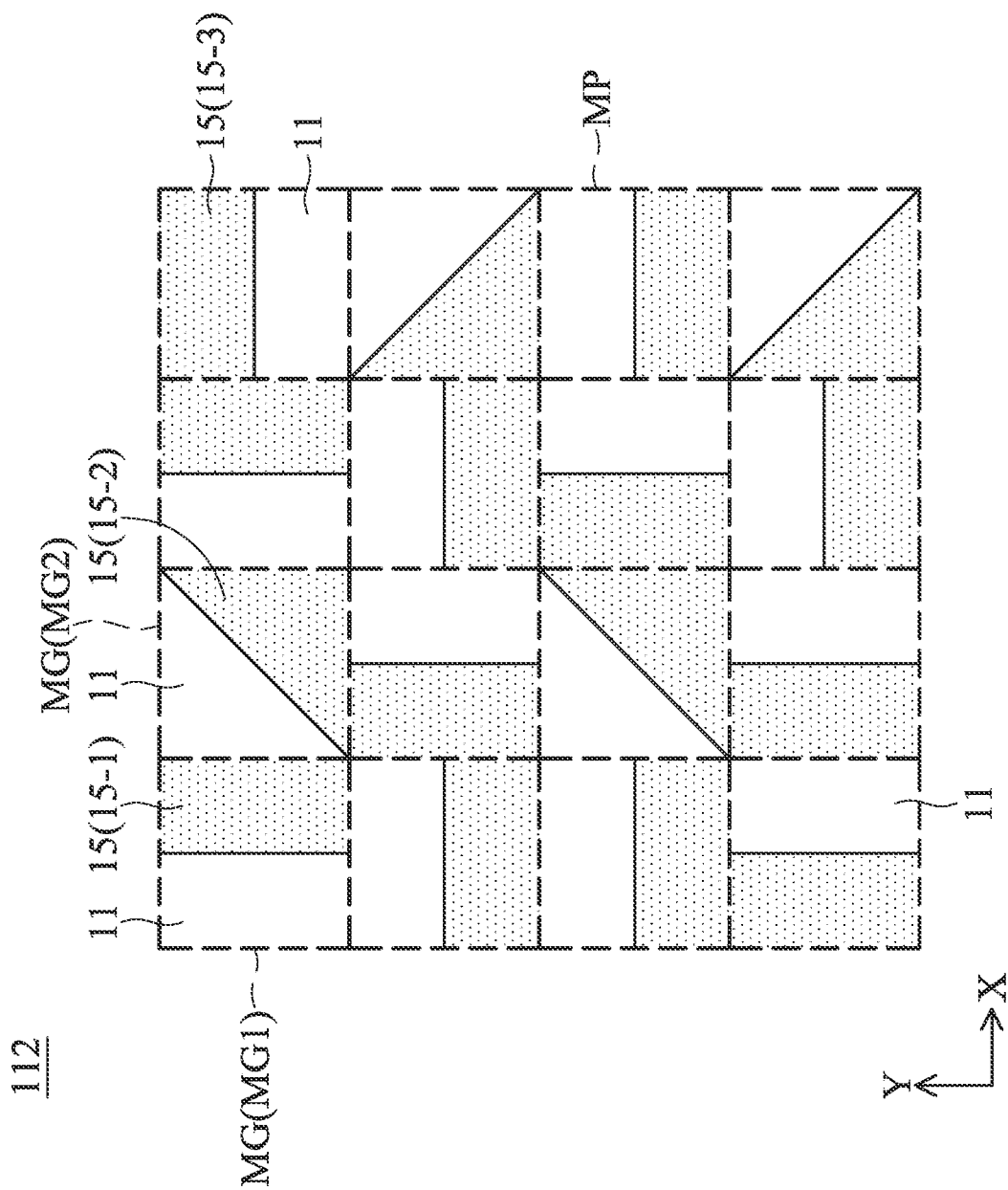
FIG. 11 illustrates an arrangement of the photoelectric conversion units and the modulation structures from the top view of a portion of the solid-state image sensor in accordance with some other embodiments of the present disclosure.

FIG. 11 illustrates an arrangement of the photoelectric conversion units 11 and the modulation structures 15 from the top view of a portion of the solid-state image sensor 112 in accordance with some other embodiments of the present disclosure. In some embodiments, from the top view of the solid-state image sensor 112, the modulation structures 15 have at least two different shapes. Moreover, in some embodiments, from the top view of the solid-state image sensor 112, the modulation structures 15 form a non-periodic structure. For example, as the top view of the solid-state image sensor 112 shown in FIG. 11, the modulation structures 15-1, 15-3 may be formed as rectangles, and the modulation structures 15-2 may be formed as right triangles, but the present disclosure is not limited thereto.

Moreover, in some embodiments, from the top view of the solid-state image sensor 112, the modulation structures 15 have different shapes in two adjacent mosaic patterns MP. In other words, in some embodiments, from the top view of the solid-state image sensor 112, the modulation structures 15 have at least two different shapes and form a non-periodic structure, which may effectively reduce petal flare. For example, as the top view of the solid-state image sensor 112 shown in FIG. 11, the modulation structures 15-1 (that is formed as a rectangle) may be disposed in the mosaic pattern MP1, and the modulation structures 15-2 (that is formed as a triangle) may be disposed in the adjacent mosaic pattern MP2, but the present disclosure is not limited thereto.

Furthermore, in some embodiments, from the top view of the solid-state image sensor 112, the modulation structures 15 extend in two perpendicular directions. For example, as the top view of the solid-state image sensor 112 shown in FIG. 11, each modulation structure 15-1 extends along Y-direction, and each modulation structure 15-3 extends along X-direction, but the present disclosure is not limited thereto.

In accordance with some embodiments of the present disclosure, the solid-state image sensor includes photoelectric conversion units and modulation structures embedded in the photoelectric conversion units. The solid-state image sensor also includes isolation structures disposed between the photoelectric conversion units and a protective layer disposed on the photoelectric conversion units. From the top view of the solid-state image sensor, the photoelectric conversion units and the modulation structures form mosaic patterns, and the ratio of the area of one modulation structure to the area of the corresponding mosaic pattern is between about 0.1 and about 0.9.

In summary, the solid-state image sensor according to the embodiments of the present disclosure includes modulation structures embedded in the photoelectric conversion units, which may change the optical path of the incident light (to be longer) without increasing the thickness of the photoelectric conversion unit, thereby improving the quality of the image signal from the photoelectric conversion units of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
    photoelectric conversion units;
    modulation structures embedded in the photoelectric conversion units;
    isolation structures disposed between the photoelectric conversion units; and
    a protective layer disposed on the photoelectric conversion units;
    wherein from a top view of the solid-state image sensor, the photoelectric conversion units and the modulation structures form mosaic patterns, a ratio of an area of one of the modulation structures to an area of a corresponding one of the mosaic patterns is between 0.1 and 0.9, and a thickness of the modulation structures is equal to $m \times \lambda / 2n$, where m is a positive integer, $\lambda$ is a wavelength of a light to be sensed, and n is a refraction index of the modulation structures.

2. The solid-state image sensor as claimed in claim 1, wherein the refraction index of the modulation structures is different from a refraction index of the photoelectric conversion units, and from the top view of the solid-state image sensor, the modulation structures form an array.

3. The solid-state image sensor as claimed in claim 1, wherein the modulation structures are disposed on top portions or bottom portions of the photoelectric conversion units.

4. The solid-state image sensor as claimed in claim 1, wherein from the top view of the solid-state image sensor, the modulation structures are in a periodic arrangement.

5. The solid-state image sensor as claimed in claim 1, wherein from the top view of the solid-state image sensor, shapes of the modulation structures comprise triangles, rectangles, squares, or trapezoids.

6. The solid-state image sensor as claimed in claim 1, wherein from the top view of the solid-state image sensor, the modulation structures have at least two different shapes.

7. The solid-state image sensor as claimed in claim 1, wherein from the top view of the solid-state image sensor, the modulation structures form a non-periodic structure.

8. The solid-state image sensor as claimed in claim 1, wherein from the top view of the solid-state image sensor, the modulation structures have different shapes in adjacent two of the mosaic patterns.

9. The solid-state image sensor as claimed in claim 1, wherein from the top view of the solid-state image sensor, the mosaic patterns form a checkerboard-like pattern.

10. The solid-state image sensor as claimed in claim 1, wherein from the top view of the solid-state image sensor, the modulation structures form a plurality of cross patterns.

11. The solid-state image sensor as claimed in claim 1, wherein from the top view of the solid-state image sensor, the modulation structures have at least two different sizes.

12. The solid-state image sensor as claimed in claim 1, wherein from the top view of the solid-state image sensor, the modulation structures extend in a same direction.

13. The solid-state image sensor as claimed in claim 1, wherein from the top view of the solid-state image sensor, the modulation structures extend in two perpendicular directions.

14. The solid-state image sensor as claimed in claim 1, wherein from the top view of the solid-state image sensor, the ratio of the area of one of the modulation structures to the area of the corresponding one of the mosaic patterns is 0.5.

15. The solid-state image sensor as claimed in claim 1, wherein from the top view of the solid-state image sensor, the ratio of the area of one of the modulation structures to the area of the corresponding one of the mosaic patterns is variable.

16. The solid-state image sensor as claimed in claim 1, further comprising:
a metal grid disposed in a bottom of the protective layer and corresponding to the isolation structures.

17. The solid-state image sensor as claimed in claim 1, further comprising:
condensing structures disposed above the protective layer, wherein each of the condensing structures corresponds to one of the photoelectric conversion units.

18. The solid-state image sensor as claimed in claim 1, further comprising:
a reflection layer disposed below the photoelectric conversion units.

19. The solid-state image sensor as claimed in claim 1, wherein the modulation structures are disposed at different depths of the photoelectric conversion units.

* * * * *